United States Patent [19]

Moon

[11] Patent Number: 5,179,726
[45] Date of Patent: Jan. 12, 1993

[54] AUTOMATIC TUNING METHOD AND APPARATUS OF DOUBLE CONVERSION TUNER

[75] Inventor: Tae-Hyung Moon, Seoul, Rep. of Korea

[73] Assignee: Samsung Electro-Mechanics Co., Ltd., Suweon, Rep. of Korea

[21] Appl. No.: 619,302

[22] Filed: Nov. 28, 1990

[30] Foreign Application Priority Data

Nov. 29, 1989 [KR] Rep. of Korea ............... 89-17411
Nov. 15, 1990 [KR] Rep. of Korea ............... 90-18479

[51] Int. Cl.$^5$ .................................. H04B 1/26
[52] U.S. Cl. ..................... 455/180.4; 455/191.2; 455/234.1; 455/314
[58] Field of Search ............ 455/314, 315, 180, 188, 455/189, 190, 168, 169, 195, 232, 233, 234, 168.1, 169.2, 180.1, 180.4, 188.1, 189.1, 195.1, 232.1, 233.1, 234.1; 358/191.1, 195.1

[56] References Cited

U.S. PATENT DOCUMENTS

| | | | |
|---|---|---|---|
| 3,872,387 | 3/1975 | Banach | 455/233 |
| 4,476,583 | 10/1984 | Muterspaugh | 455/180 |
| 4,499,602 | 2/1985 | Hermeling, Jr. et al. | 455/180 |
| 4,581,643 | 4/1986 | Carlson | 455/314 |
| 4,843,639 | 6/1989 | Hendriks et al. | 455/182 |
| 5,012,235 | 4/1991 | Andros et al. | 455/182 |

*Primary Examiner*—Reinhard J. Eisenzopf
*Assistant Examiner*—Edward Urban
*Attorney, Agent, or Firm*—Webb, Burden, Ziesenheim & Webb

[57] ABSTRACT

This invention relates to an automatic tuning method and apparatus in which tuning voltage corresponding to picture/sound carrier wave difference of channel selected by double conversion tuner is transmitted to voltage control oscillator to thereby be re-tuned so that input filter inseting loss according to said picture/sound carrier wave is minimized, which is characterized by comprising automatic tuning device comprising, phase locked loop PLL circuit for controlling oscillation signal of local oscillator of tuning circuit, video intermediate frequency VIF producing circuit which receives output signal of said tuning circuit whereby outputting RF automatic gain control AGC signal and IF automatic gain control signal, and automatic tuning means which receives two output signals from said video intermediate frequency producing circuit whereby controlling band pass filter signal of the tuning circuit.

9 Claims, 4 Drawing Sheets

AUTOMATIC TUNING METHOD AND APPARATUS OF DOUBLE CONVERSION TUNER

BACKGROUND OF THE INVENTION

The present invention relates to an automatic tuning method and apparatus of a double conversion tuner, and more particularly, to an automatic tuning method and apparatus of a double conversion tuner in which tuning voltage corresponding to picture/sound carrier wave difference of a channel selected by double conversion tuner is transmitted to a voltage controlled oscillator to thereby be re-tuned so that the input filter inserting loss according to said picture/sound carrier wave is minimized.

Generally, tuning systems within television TV receivers use a number of tuners contained respectively with mixers in order to receive signals within a number of TV frequency bands. For example, a first tuner selects the channel within a VHF-TV frequency band (54 to 88 and 174 to 216 MHz) and a second tuner selects the channel within UHF-TV frequency band (470 to 890 MHz). When the TV receiver is preferred to receive a cable television CATV signal, the tuning system for this should be added with a third tuner and mixed.

A double conversion tuning system for preventing complexity of a number of tuners and expensive cost is described for receiving broadcasting (air isolation) VHF-TV and UHF-TV signals as described in title of "high capacity TV" by D. L. arch on consumer electronic IEEE manual CE-24, 1st edition, February 1978, p 39–46. However, simple and cheap tuning systems for receiveing VHF-TV, UHF-TV and CATV signal is required.

For this purpose, heretofore, as the technical contents of U.S. Pat. No. 4,408,348, it is constituted with control device for generating tuning signal having a magnitude determined by frequency of selected channel; a first filter device for selecting an RF (radio frequency) signal corresponding to the channel selected from a first tuning band (low band) containing a lower frequency part of said first cable band (MB-CATV) and said first broadcasting band (L-VHF) in response to said tuning signal; a second filter device for selecting RF signals corresponding to the channel selected from a second tuning band (high band) containing an upper frequency part of said first cable band (MB-CATV), said second broadcasting band (H-VHF) and at least lower frequency part of said second cable band (SB-CATV) in response to said tuning signal, and a filter selecting device for operating said first filter device when the selected channel is at said first tuning band (low band) and for operating said second filter device when the selected channel is at said second tuning band (high band); and a multiple tuning system produces IF (intermediate frequency) signal from the RF signal in sequence of the first broadcasting band, the first cable band, the second broadcasting band and the second cable band.

Control devices produce tuning signals having a magnitude determined by frequency of a selected channel.

The first filter selects an RF signal corresponding to the channel selected from the lower frequency part of the first cable band and the first tuning band including a first broadcasting band in response to the tuning signal. The second filter selects an RF signal corresponding to the channel selected from the first cable band, the second broadcasting and the second tuning band in response to the tuning signal.

A selecting device operates the first filter when the selected signal is within the first tuning band, and operates the second filter when the selected channel is within the second tuning band. And a single conversion varactor tuner is utilized for utilizing broadcasting spectrum of television, and according to this single conversion varactor tuner, since the tuning voltages applied to varactor diodes of a voltage controlled oscillator (hereinafter, this will be abbreviated as VCO) and the radio frequency (hereinafter, called as RF) tuning circuit are the same, it is possible to tune said single conversion varactor tuner by one tuning voltage. However, double conversion tuners should be utilized in order to utilize the broadcasting spectrum by using signals of more kinds than signals inputted to said single conversion varactor tuner and higher frequency signals, and according to this double conversion tuner, tuning voltages applied to varactor diodes of VCO and RF tuning circuit are respectively different.

Since the VCO and RF tuning circuits of said double conversion tuner are tuned respectively by different frequency, when the tuning voltages are applied, there has been problem that input filter inserting loss becomes larger.

OBJECT AND SUMMARY OF THE INVENTION

Therefore, the present invention is invented to solve the above-described conventional various problems, and it is an object of the present invention to provide an automatic tuning method and apparatus of a double conversion tuner for applying a tuning voltage to an RF tuning circuit which is different from the VCO tuning voltage applied to the double conversion tuner by utilizing a picture/sound carrier wave of an input channel inputted to the double conversion tuner.

In order to accomplish the aforementioned object of the present invention, the invention is characterized, in a tuning circuit of a tuner comprising a plurality of band pass filters for processing an RF signal inputted from an antenna input terminal and a high frequency amplifier as well as a matching circuit, a plurality of local oscillators for generating an oscillation signal with matching said inputted RF signal, and a plurality of mixers for outputting by mixing output signals of said matching circuit and local oscillator; by comprising a phase locked loop (PLL) circuit for controlling an oscillation signal of a local oscillator of said tuning circuit, video intermediate frequency producing circuit which receives an output signal of said tuning circuit whereby outputting an RF automatic gain control (AGC) signal and an IF automatic gain control signal, and automatic tuning means which receives two output signals from said video intermediate frequency producing circuit whereby controlling the band pass filter signal of said tuning circuit, and said automatic tuning section comprises a plurality of A/D converters for converting two analog signals from said video intermediate frequency producing circuit to a digital signal, ROM memory element contained with a control program which is automatic tuning method of the present invention, a microprocessor for operating said signal converted to digital and the control program contained within ROM memory device, a plurality of D/A converters for converting two digital signals processed by said microprocessor to an analog signal, and operational amplifier which compares output signals of said two D/A converters whereby controlling said tuning circuit; and according to the above described configuration, further comprising a first step which tunes the VCO circuit by the PLL circuit, and tuning the RF signal by the tuning signal read out by the program contained within memory element of the microprocessor whereby comparing AGC voltage of the picture carrier wave and maximum AGC voltage; a second step which uses the IF AGC voltage when the maximum AGC voltage value is less or equal at said first step, and when the maximum AGC voltage is larger, proceeding and then controlling the tuning voltage such that the AGC voltage obtains maximum gain value whereby storing said AGC value to memory element and also adding +4.5 MHz to the oscillation frequency of the input signal whereby controlling the VCO; a third step which detects the sound carrier wave and controlling its tuning voltage such that the AGC voltage of said sound carrier wave obtains maximum gain value whereby storing to memory element and then controlling the VCO by the oscillation frequency; a fourth step which controls the RF signal by tuning voltage that a value subtracted the chrominance carrier wave voltage from the sound carrier wave voltage is subtracted from picture carrier wave voltage and then storing said tuning voltage to the memory element; a fifth step in which a value subtracted the AGC voltage of the picture carrier wave from the AGC voltage of the sound carrier wave is subtracted from the AGC voltage of the picture carrier wave whereby setting to new picture carrier wave AGC voltage and also setting the AGC voltage of the picture carrier wave to the AGC voltage of the new sound carrier wave; a sixth step which compares the absolute value of the AGC voltage difference of new picture sound carrier wave of said fifth step with the fixed numeric value corresponding to gain value difference at the time when the AGC voltage of said new picture/sound carrier wave has become equal to a predetermined degree; a seventh step in which the AGC voltage of the newly determined sound carrier wave becomes a final tuning voltage when the absolute value and the fixed numeric value are equal at said sixth step, and when the fixed numeric value is different and the AGC voltage of the picture carrier wave becomes larger than the AGC voltage of the new sound carrier wave, changing the tuning voltage whereby storing to the memory element; and an eighth step which changed again the AGC voltage of picture/sound carrier wave of said seventh step whereby changing the tuning voltage of the picture carrier wave so that making to execute said sixth step.

The forgoing and other objects as well as advantages of the present invention will become clear by the following description of the invention with reference to the accompanying drawings.

BRIEF DESCRIPTION OF THE DRAWINGS

For a better understanding of the invention, and to show how the same may be carried out into effect, reference will now be made, by way of example, with respect to the accompanying drawings, in which.

DETAILED DESCRIPTION OF THE PREFERRED EMBODIMENT

Figure 3:
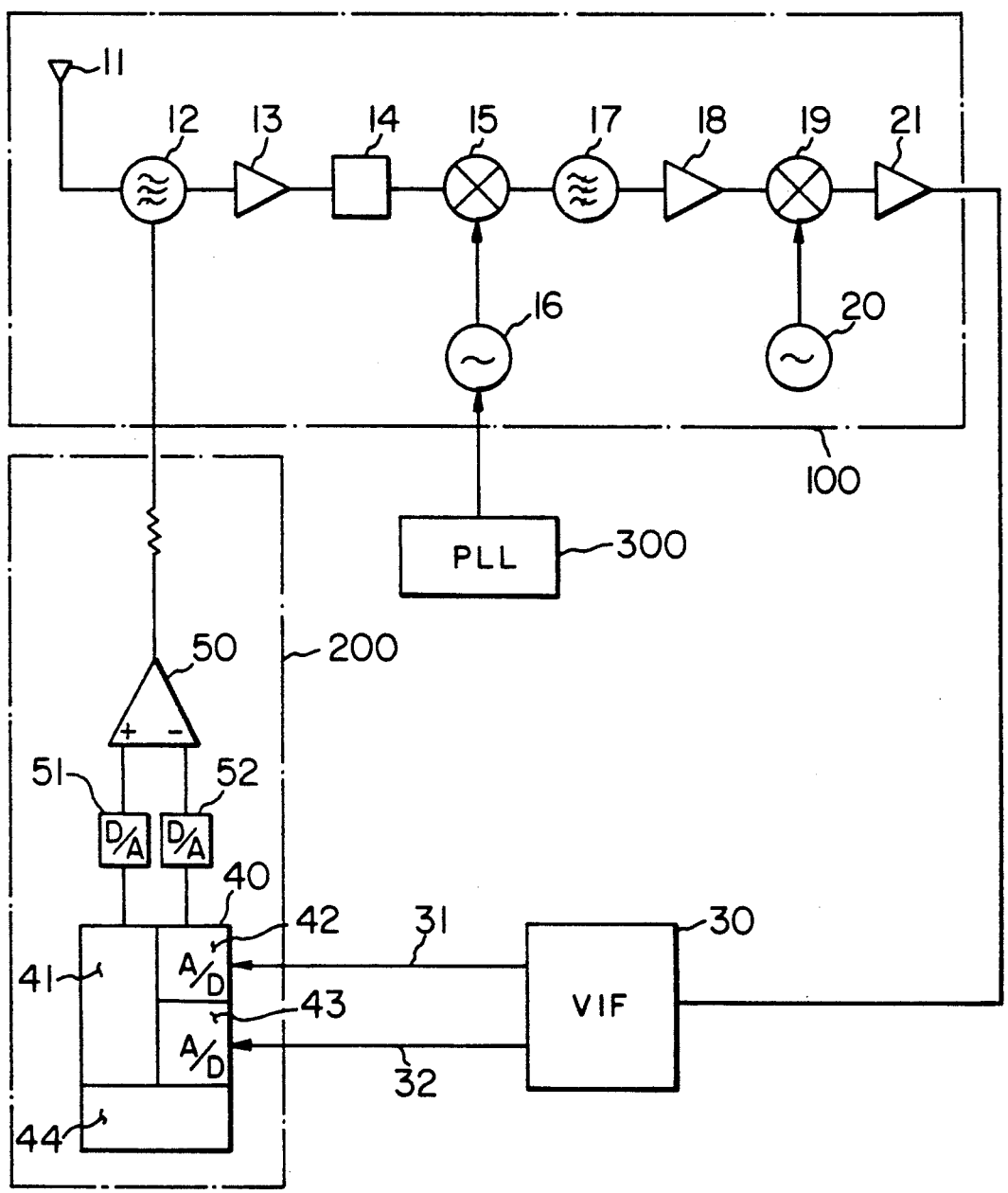
FIG. 3 is a block diagram of configuration applied with the method of the present invention.

Hereinafter, a preferred embodiment of the present invention will be described in detail with reference to the accompany drawings FIG. 3 is a block diagram of system applied with automatic tuning method of double conversion tuner according to the present invention.

In said FIG. 3, an RF input signal coming from an antenna 11 input stage is passed through a first band pass filter 12 and being sufficiently amplified at a first RF amplifier 13 and then passing through a matching circuit 14 to thereby be applied to a first mixer 15. Said first mixer 15 mixes the input signal from said matching circuit 14 and an input signal from a first local oscillator 16 and then applying through a second band pass filter 17 to a second RF amplifier 18.

At this moment, the first local oscillator 16 is controlled by PLL circuit 300 which is a control means for controlling VCO 100.

The signal applied to said second RF amplifier 18 is sufficiently amplified to thereby be mixed with the output signal of a second local oscillator 20 at a second mixer 19.

The signal mixed at said second mixer 19 is amplified again at third RF amplifier 21 to thereby be applied to video intermediate frequency producing circuit 30.

Then, said VIF producing circuit 30 produces RF AGC signal 31 and IF AGC signal 32 to thereby respectively apply to analog/digital A/D converters 42, 43 of micom control device 40.

Said micom control device 40 is constructed in such a manner that ROM memory 44 and microprocessor 41 are connected to said A/D converters 42, 43.

The digital signal of the RF AGC and the digital signal of the IF AGC converted by said A/D converters 42, 43 are processed by the operation of said microprocessor 41 to thereby be respectively applied to digital/analog D/A converters 51, 52.

Then, said D/A converters 51, 52 convert the digital signal processed by said microprocessor 41 to analog signal to thereby be applied through comparator 50 for comparing the RF tuning voltage to said first band pass filter 12 whereby controlling the switching band.

Figure 1A:
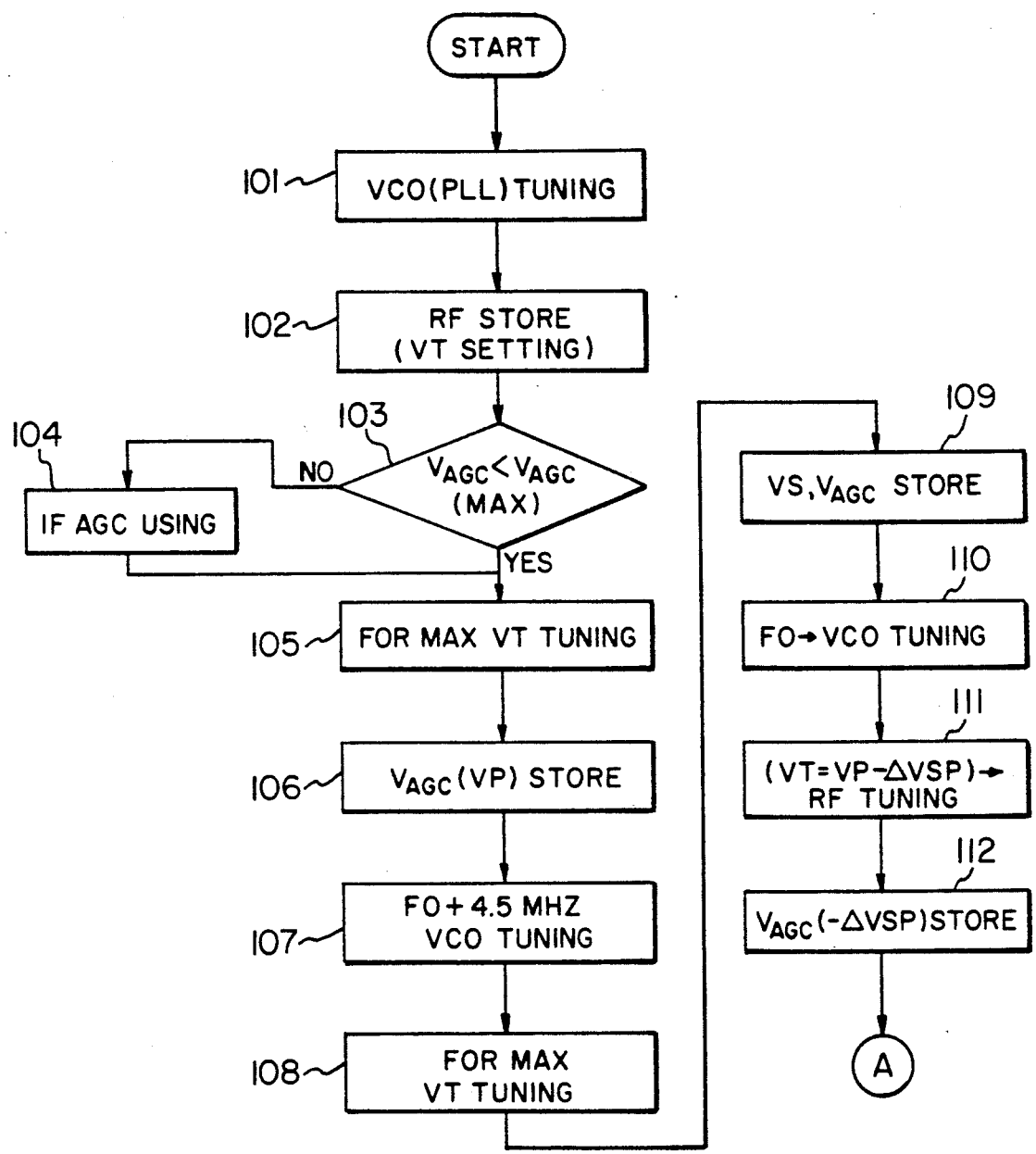
FIGS. 1A and 1B are flow charts of a preferred embodiment of automatic tuning method according to the present invention.
Figure 1B:
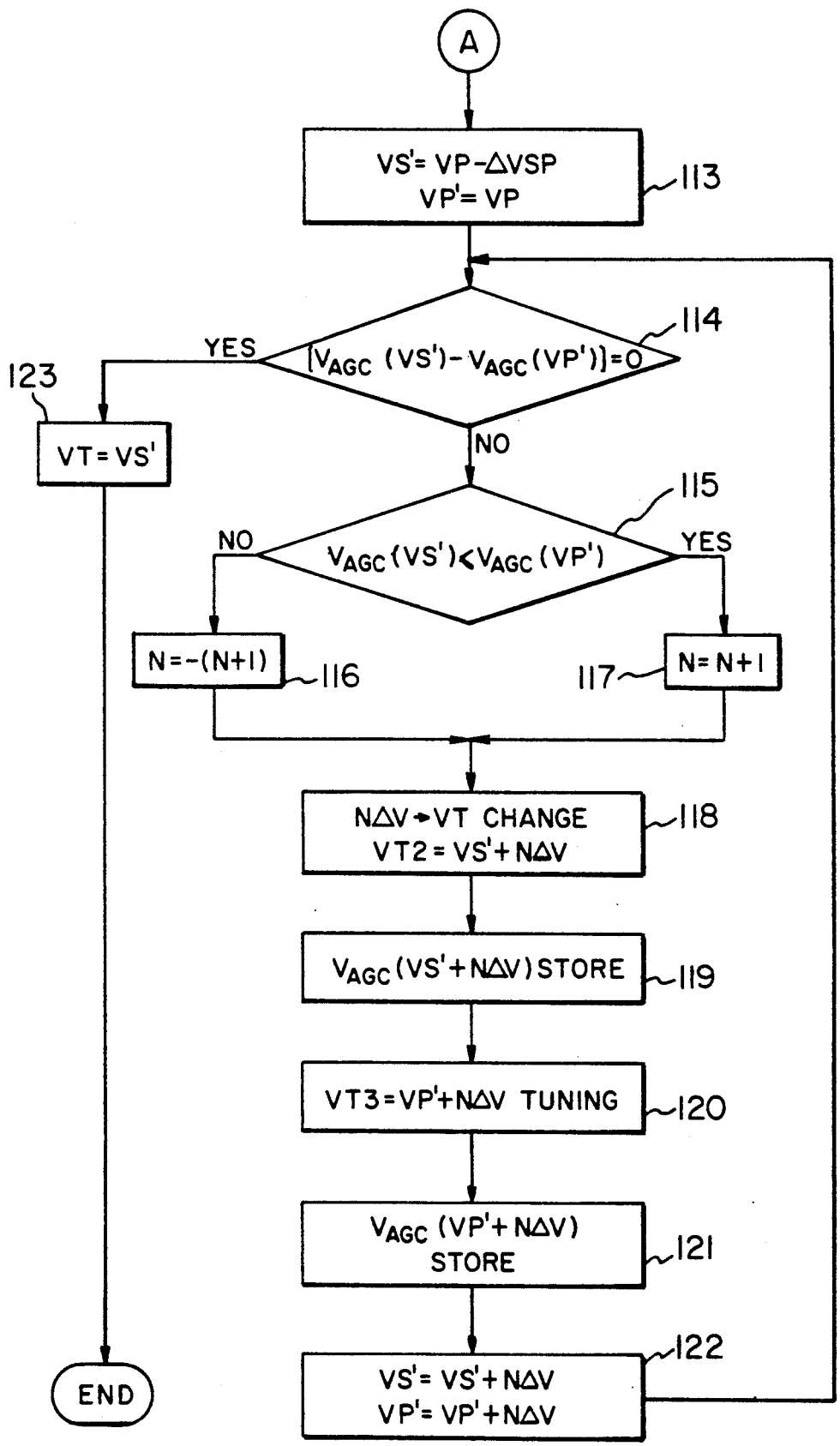

FIGS. 1A and 1B are flow charts for illustrating a preferred embodiment of automatic tuning method according to the present invention.

In FIG. 1A, in order to match the correct VCO frequency, the VCO tuning step 101 for tuning the VCO by utilizing PLL circuit 300 is passed through.

After said VCO tuning step 101 is passed through, in order to obtain maximum gain, RF voltage tuning step 102 for tuning the RF voltage by a tuning voltage VT is read out by a program control contained within ROM memory element 44 of the microprocessor 41.

Said RF tuning is tuned by three bands, and band switching is made according to the channel tuned by the VCO. Here, the RF tuning voltage is determined in response to the AGC voltage change of the tuner and IF amplifier, and it is determined by sweeping the tuning voltage so as to be maximum gain within the RF tuning voltage range according to the desired channel.

Said sweeping (a kind of scanning) process is as followings.

After said RF tuning step 102 is passed through, the AGC voltage controlled by a picture carrier wave VP and the maximum AGC voltage read out at ROM memory element 44 are compared at step 103.

Figure 2A:
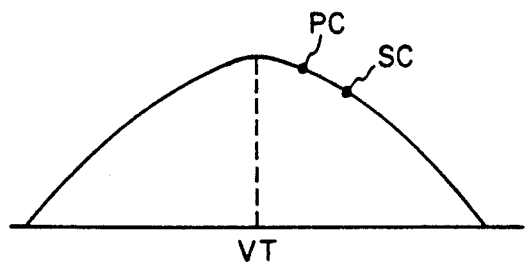
FIGS. 2A-2F are graphs which illustrate a preferred embodiment of automatic tuning method according to FIGS. 1A and 1B.

AT said RF voltage tuning step 102, the waveform of FIG. 2A is appeared.

Here, PC is the picture carrier wave, and SC is the sound carrier wave.

Figure 2F:
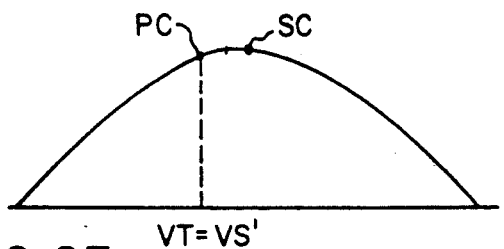
Figure 2B:
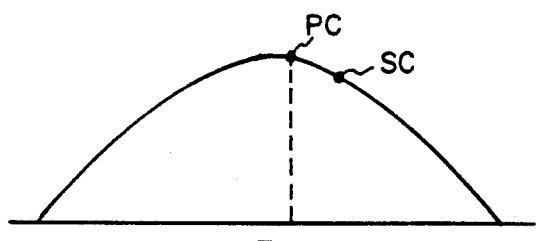

When the maximum AGC voltage is equal to or less than the AGC voltage value tuned by picture carrier wave of the input signal at said maximum AGC voltage comparing step 103, the IF AGC voltage at step 104 is used, and when the maximum AGC voltage is larger than the AGC voltage tuned by said picture carrier wave, moving to step 105; tuning voltage VT is tuned such that the AGC voltage according to the picture carrier wave VP obtains maximum gain, and storing the AGC voltage $V_{AGC}$(VP) according to the picture carrier wave at this moment to the memory element at step 106. At said step 105, the waveform of FIG. 2B is appeared. At said B waveform, tuning voltage VT moves to a position same as voltage VP by picture carrier wave.

On the other hand, after passing the step 107 for tuning the VCO by addding +4.5 MHz to oscillation frequency Fo according to the RF signal, the tuning voltage VT is controlled so as the AGC voltage according to the sound carrier wave obtains maximum gain at step 108.

At said step 107, the reason for the increased F0 +4.5 MHz is for finding out the AGC voltage VS of the sound carrier wave, and said 4.5 MHz is a value SC-PC subtracting the picture carrier wave PC from the sound carrier wave SC.

Therefore, after tuning the VCO so as to increase as much as 4.5 MHz, it is determined by tuning sweeping such that this value becomes maximum gain.

Figure 2C:
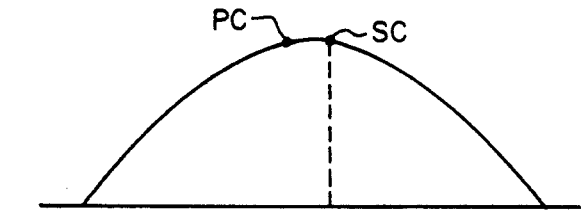

At said step 108, the waveform of FIG. 2C is appeared.

At said waveform of FIG. 2C, tuning voltage VT is accorded with voltage VS.

AGC voltage VS, $V_{AGC}$ (VS) obtained by adjusting the tuning voltage VT at said step 108 are stored to memory element at step 109, and the VCO is adjusted for matching the oscillation frequency F0 according to RF signal at step 110. And, in order to match a value (VS−Vp=ΔVSP) subtracting the picture carrier wave PC voltage VP from the sound carrier wave voltage VS into the tuning voltage VT which is a value (VP−ΔVSP), it is passed through the step 111 for adjusting the RF signal and then the AGC voltage $V_{AGC}$ (−ΔVSP) according to said tuning voltage (VP−ΔVSP) is stored to memory element at step 112.

Figure 2D:
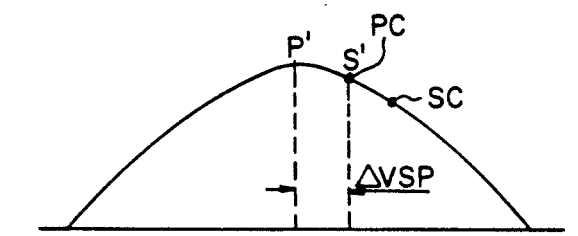

At said step 111, the waveform of FIG. 2D is appeared.

The AGC voltage of said step 112 is substituted by AGC voltage value (VP'=VP) of the new picture carrier wave PC at step 113 in FIG. 1B and AGC voltage of said picture carrier wave PC is substituted by the AGC value (VS'=VP−ΔVSP) of new sound carrier wave SC.

Figure 2E:
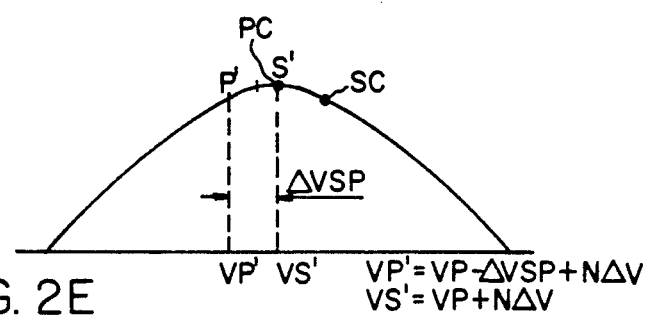

At said step 113, the waveform of FIG. 2E is appeared. The AGC voltage of the new picture/sound carrier wave of said step 113 is compared at step 114 and how much degree the absolute value ($|V_{AGC}(VS')-V_{AGC}(VP')|$) of the difference has become similar with the AGC voltage value VS' of the sound carrier wave SC and the AGC voltage value VP' of the picture carrier wave PC, that is, whether the gain ($V_{AGC}$(−ΔVSP)) of the sound carrier wave is the same with the gain ($V_{AGC}$(P)) of the picture carrier wave. At said step 114, when the gain of the sound carrier wave and the gain of the picture carrier wave are equal, the AGC voltage value VP' of said picture carrier wave is processed to the tuning voltage VT at step 123, and then it is terminated.

As a result of comparing at said step 114, when the absolute value is different from fixed number 0, the AGC voltage value VS' of the new sound carrier wave SC and the AGC voltage value VP' of new picture carrier wave PC are compared at step 115 and when the AGC voltage value VP' is larger than the AGC voltage value VS' of the sound carrier wave SC, the gain fixed number N for changing the tuning voltage VT is subtracted ($N=-(N+1)$) at step 116, and when the AGC voltage value VP' of the picture carrier wave PC is smaller than the AGC voltage value VS' of the sound carrier wave SC, the gain fixed number N for changing the tuning voltage VT is added ($N=N+1$) at step 117.

The second tuning voltage (VT2=VS'+NΔV) is determined at step 118 that varying voltage ΔV is multiplied NΔV to the gain fixed value N adjusted at said steps 116 and 117 to thereby be added to the AGC voltage value VS' of the sound carrier wave SC, and the AGC voltage $V_{AGC}$ (VS'+NΔV) according to said tuning voltage VT2 is stored to the memory element at step 119.

The AGC value (VP'+NΔV) stored at said step 119 is a voltage gain value in case when the tuning voltage of the sound carrier wave SC is moved to left side of the waveform as much as 1 MHz.

And, third tuning voltage (VT3=VP'+NΔV) is adjusted at step 120 in which a value NΔV multiplied with said gain fixed number N and varying voltage ΔV is added to the AGC voltage value VP' of the picture carrier wave PC, and the AGC voltage $V_{AGC}$ (VP'+NΔV) of the third tuning voltage VT3 adjusted by said step 120 is stored at step 121, and thereafter the picture/sound carrier wave tuning voltages VT2, VT3 of said steps 118 and 120 are determined (substituted) by the AGC voltage value (VS'=VS'+NΔV) of another sound carrier wave VS', SC and the AGC voltage value (VP'=VP'+NΔV) of the picture carrier wave PC at step 122 and then being returned to said step 114 to thereby be circulated until said absolute value ($|V_{AGC}(VS')-V_{AGC}(VP')|$) and the fixed value 0 become equal, and thereby said absolute value and the fixed value 0 become to equal, the AGC voltage value VP' of the picture carrier wave PC is determined to a final tuning voltage VT at step 123. At said step 123, the waveform of FIG. 2F is appeared.

Here, said varying voltage ΔV is a voltage increasing by sweeping by 1 MHz with the value of ΔV=ΔVSP/4.5.

As described above, the present invention has the advantage that the input filter inserting loss corresponding to the picture/sound carrier wave by selecting the tuning voltage applied to the varactor diode of input RF tuning circuit corresponding to the channel which selected the respectively different tuning voltage of the double conversion tuner as a method according to the microprocessor.

It will be appreciated that the present invention is not restricted to the particular embodiment that has been described hereinbefore, and that variations and modifications may be made therein without departing from the spirit and scope of the invention as defined in the appended claims and equivalents thereof.

I claim:

1. A method for automatically tuning a double conversion tuner, said method comprising the steps of:
   a) tuning a voltage controlled oscillator (VCO) circuit by a phase locked loop (PLL) circuit and tuning a radio frequency (RF) signal by a tuning voltage generated by a program contained within a memory element of a microprocessor which compares the automatic gain control (AGC) voltage of a picture carrier wave with a maximum AGC voltage;
   b) if the maximum AGC voltage is less than or equal to the picture carrier wave AGC voltage, then an intermediate frequency (IF) AGC voltage is used as the tuning voltage and stored in memory; however, if the maximum AGC voltage is greater than the picture carrier wave AGC voltage, then the tuning voltage is adjusted to the maximum AGC voltage and stored in memory, and then a 4.5 MHz signal is added to the oscillation frequency of the VCO circuit;
   c) detecting a sound carrier wave and adjusting its tuning voltage such that the AGC voltage of the sound carrier wave has a maximum gain value, then storing said value in the memory and then adjusting the sound carrier wave by the oscillation frequency of the VCO circuit;
   d) adjusting the RF signal by an RF tuning voltage having a value equal to the difference between the picture carrier wave voltage and the sound carrier wave voltage, and storing said RF tuning voltage in said memory;
   e) subtracting the AGC voltage of the picture carrier wave from the AGC voltage of the sound carrier wave and generating a second picture carrier wave AGC and equating the AGC voltage of the second sound carrier wave to the AGC voltage of the picture carrier wave;
   f) comparing the absolute value of the AGC voltage difference between the second picture carrier wave and second sound carrier wave generated in step (e) with a fixed numeric value corresponding to the gain value difference at the time when an AGC voltage of a third picture/sound carrier wave has become equal to a predetermined degree;
   g) using the AGC voltage of said third picture/sound carrier wave as a final tuning voltage when the absolute value and the fixed numeric value are equal at step (f), and, when the values are different, if the AGC voltage of the third picture carrier wave is greater than the AGC voltage of the third sound carrier wave, then changing the tuning voltage according to this compared value and storing it in memory; and
   h) changing the AGC voltage of the third picture/sound carrier wave in step (g) in accordance with changes in the tuning voltage of the third picture carrier wave, and then repeating steps (f) and (g) above.

2. Apparatus for automatically tuning a double conversion tuner comprising:
   a) a tuning circuit including a plurality of band pass filters for processing an RF signal inputted from an antenna input terminal, a high frequency amplifier and matching circuit, a plurality of local oscillators for generating oscillation signals to be matched to said inputted RF signal, and a plurality of mixers for mixing the outputs signals of the oscillators and the matching circuit;
   b) a phase locked loop circuit for controlling the oscillation signal of a first of said local oscillators of said tuning circuit;
   c) a video intermediate frequency producing circuit which receives the output signal of said tuning circuit and produces a radio frequency automatic gain control signal and an intermediate frequency automatic gain control signal; and
   d) automatic tuning means which receives the gain control signals from said video intermediate frequency producing circuit and thereby controls a first of said band pass filters of said tuning circuit, wherein the automatic tuning means includes a pair of analog-to-digital converters for converting the gain control signals from said video intermediate frequency producing circuit into digital signals, a microprocessor which operates by said converted digital signals and by a control program contained within a ROM memory in said microprocessor, a pair of digital-to-analog converters for converting digital signals generated by said microprocessor into analog signals, and an operational amplifying comparator which compares the output signals of said digital-to-analog converters and generates a signal for controlling said tuning circuit.

3. The method of claim 1, wherein the RF tuning voltage is adjusted in response to the AGC voltage variation of the tuner and an IF amplifier.

4. The method of claim 1 wherein the AGC value stored in memory at step (b) is the AGC value of the picture carrier wave, and the AGC voltage of the sound carrier wave is adjusted by adding 4.5 MHz to the oscillation frequency of the input signal.

5. The method of claim 1 wherein the AGC value stored in memory at step (c) is the AGC value of the sound carrier wave, and the VCO is adjusted to match the oscillation frequency of the RF signal.

6. The method of claim 1 wherein the value stored in memory at step (g) is the gain in the AGC value when the sound carrier wave is increased by 1 MHz.

7. The method of claim 1 wherein the tuning voltage change at step (g) is changed by either increasing or decreasing a gain fixed value.

8. The method of claim 1 wherein the tuning voltage changes at step (h) are according to $VT2 = VS' + N \Delta V$ and $VT3 = VP' + N \Delta V$, where VT2 is a second tuning voltage,
   VT3 is a third tuning voltage,
   $\Delta V$ is a varying voltage,
   N is a fixed number,
   VS' is the AGC voltage of the sound carrier wave, and
   VP' is the AGC voltage value of the picture carrier wave,
   and the AGC voltages of the tuning voltages VT2, VT3 are stored in memory.

9. The method of claim 7 wherein the varying voltage $\Delta V$ satisfies $$\Delta V = \frac{\Delta VSP}{4.5 \text{ MHz}},$$

where
   $\Delta VSP$ is the difference between the sound carrier wave voltage and the picture carrier wave voltage, and 4.5 MHz is the difference between the picture carrier frequency and the sound carrier frequency.

* * * * *